United States Patent
Hollaender et al.

(10) Patent No.: US 12,313,767 B2
(45) Date of Patent: May 27, 2025

(54) METHOD FOR MANUFACTURING A RADAR SENSOR

(71) Applicant: Robert Bosch GmbH, Stuttgart (DE)

(72) Inventors: Christian Hollaender, Waldbronn (DE); Klaus Baur, Mietingen (DE); Armin Himmelstoss, Weissach Im Tal (DE); Gustav Klett, Moessingen (DE); Michael Schoor, Stuttgart (DE); Minh Nhat Pham, Leinfelden-Echterdingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 605 days.

(21) Appl. No.: 17/643,493

(22) Filed: Dec. 9, 2021

(65) Prior Publication Data
US 2022/0196792 A1 Jun. 23, 2022

(30) Foreign Application Priority Data
Dec. 21, 2020 (DE) .................... 10 2020 216 362.6

(51) Int. Cl.
*G01S 7/03* (2006.01)
*G02B 6/122* (2006.01)
*H01L 23/66* (2006.01)
*H01Q 1/22* (2006.01)
*H01Q 23/00* (2006.01)

(52) U.S. Cl.
CPC ............ *G01S 7/032* (2013.01); *G02B 6/1228* (2013.01); *H01L 23/66* (2013.01); *H01Q 1/2283* (2013.01); *H01L 2223/6677* (2013.01); *H01Q 23/00* (2013.01)

(58) Field of Classification Search
None
See application file for complete search history.

(56) References Cited

U.S. PATENT DOCUMENTS

| | | | | |
|---|---|---|---|---|
| 10,109,604 | B2 * | 10/2018 | Topak | H01L 25/0655 |
| 2020/0296823 | A1 * | 9/2020 | Kamgaing | H05K 1/0243 |
| 2021/0225719 | A1 * | 7/2021 | Seler | H01L 21/4817 |
| 2022/0109247 | A1 * | 4/2022 | Brandenburg | H01Q 21/0068 |

* cited by examiner

*Primary Examiner* — Whitney Moore
(74) *Attorney, Agent, or Firm* — NORTON ROSE FULBRIGHT US LLP

(57) ABSTRACT

A method for manufacturing a radar sensor. In the method, a circuit board is provided. A surface of the circuit board is equipped with a radar transceiver. A waveguide structure made of plastic material is provided. Waveguide channels including at least one metallic conductively coated side wall in the waveguide structure and an open side are formed. The waveguide structure is soldered to a surface of the circuit board, the open side being oriented in the direction of the circuit board.

10 Claims, 5 Drawing Sheets

METHOD FOR MANUFACTURING A RADAR SENSOR

CROSS REFERENCE

The present application claims the benefit under 35 U.S.C. § 119 of German patent Application No. DE 102020216362.6 filed on Dec. 21, 2020, which is expressly incorporated herein by reference in its entirety.

FIELD

The present invention relates to a method for manufacturing a radar sensor including a waveguide structure, which is soldered onto a circuit board, and to a corresponding radar sensor.

BACKGROUND INFORMATION

Today, radar sensors are used in vehicles, for example, to implement comfort functions, such as e.g., adaptive cruise control, and safety functions, such as e.g., emergency braking assistants. Radar sensors directly measure the relevant physical variables, such as e.g., the distance from a target, without being dependent on an interpretation of images, as takes place, e.g., with an optical camera.

Radar sensors emit high-frequency radar signals via an antenna structure in the direction of an object and usually receive the radar signals reflected on the object via the same antenna structure. With the aid of the emitted and received radar signals, a distance and a direction (i.e., an angle) with respect to the object may be ascertained. Moreover, the relative velocity of the object in relation to the radar sensor may be ascertained. Typical radar sensors operate in a frequency range between 76 GHz and 81 GHz.

Antenna structures for radar sensors are designed, on the one hand, as planar antennas on a circuit board, primarily as microstrip antennas. On the other hand, 3D waveguide antennas are used, which have higher performance factors, such as e.g., a lower loss of power, and a large bandwidth compared to the planar antennas. The 3D waveguide antennas are typically made up of multiple layers, which have to be glued or soldered to one another in a complex process. Moreover, the waveguide antenna has to be attached with the aid of screws or glued to the circuit board in a complex process during assembly.

SUMMARY

In accordance with an example embodiment of the present invention, a method for manufacturing a radar sensor is provided, in which the following steps are carried out: A conventional circuit board is provided, which is to serve as the basis for the radar sensor. The circuit board may, for example, be manufactured by a cost-effective standard FR4 technology. The circuit board includes a material which is suitable for soldering, for example a copper structure, which is typically present in a circuit board, or a soldering paste, which is applied prior to soldering.

Moreover, a radar transceiver is provided, which generates radar signals which are output by an antenna structure of the radar sensor, and which picks up radar signals which are received via the antenna structure. The radar transceiver is preferably a surface-mounted device (SMD) and, in particular, a monolithic microwave integrated circuit (MMIC). The radar transceiver may also be designed as a separate transceiver unit. A surface of the circuit board is equipped with the radar transceiver.

A waveguide structure made of plastic is provided. The waveguide structure is initially a plastic block. As is described hereafter, waveguide channels are formed in the waveguide structure. The waveguide structure serves as an antenna structure for the radar sensor, and the waveguide channels serve as a waveguide for the radar signals which are to be emitted by the radar sensor and picked up by the radar sensor. The waveguide channels are designed in such a way that they include at least one metallic conductively coated side wall in the waveguide structure, and additionally include an open side which is not delimited by the waveguide structure. The metallic conductive coating is made up of a metal and is electrically conductive. The open side is designed on the same side of the waveguide structure for all waveguide channels. Depending on their shape, the waveguide channels may each include multiple side walls. The shapes of the individual waveguide channels may differ from one another. In the waveguide structure, all side walls which form the waveguide channels are coated with the metallic conductive coating. The metallic conductive coating may only be formed at the at least one side wall or partially or completely surround the waveguide structure.

In accordance with an example embodiment of the present invention, the waveguide structure is soldered to a surface of the circuit board. The waveguide structure is aligned in such a way in the process that the open side of the waveguide channels is oriented in the direction of the circuit board. Conventional soldering methods may be used to connect the waveguide structure to the circuit board. For example, reflow soldering using soldering paste mask printing is used in the process. The electrically conductive coating of the waveguide structure may be soldered directly to the material of the circuit board which is suitable for soldering, i.e., the copper structure or a soldering paste. Moreover, holes or slots may be provided next to the waveguide channels, with the aid of which an optimized heat transport to the solder spot is achieved, for example by heating with the aid of infrared radiation. By connecting the waveguide structure and the circuit board, the open side of the waveguide channels is closed by the circuit board so that completely enclosed, conductive waveguide channels are formed.

As a result, the waveguides are thus formed by the at least one side wall in the waveguide structure and the circuit board in that the waveguide structure and the circuit board are soldered to one another. This offers multiple advantages: By utilizing the surface of the circuit board, it is possible to use a one-piece waveguide structure. In contrast to the typically used multi-layer and complex plastic or sheet metal stack structures, which usually have to be glued, soldered or screwed to one another, this structure offers a less complex and cost-effective design. By reducing the number of required components, dispensing with special high-frequency materials in the circuit board manufacture, and reducing the process steps for assembling the assembly to only one soldering process, an optimal price-performance ratio is obtained, with stable and simple assembly processes. Due to the decreased complexity and the reduction of the process steps, additionally the stability, the quality, and the service life are increased. At the same time, the soldered joint is used to mechanically fix the waveguide structure to the circuit board. A tensile force arises during the soldering process, which ensures that the waveguide channels are closed all the way around in a planar manner, without critical air gaps. This results in a very good high-frequency connection. Moreover, a melting of the solder occurs during the soldering process, so that surface tension arises in the solder. In this way, a self-centering of the waveguide structure and of the circuit board takes place during the soldering process, thereby compensating for assembly tolerances to a certain degree during joining. Consequently, the waveguide channels may be pulled into the correct position on the circuit board even if the two components are slightly twisted or slightly offset with respect to one another.

In general, different shapes are possible for the waveguide channel. The waveguide channel preferably has the shape of a rectangle in the cross-section. In a rectangular waveguide, the radar signal may be fed using easy to implement modes. In this case, three side walls are designed with a metallic conductive coating in the waveguide structure, and the fourth side is the open side, which is delimited by the circuit board after the soldering. It is also possible for (semi-) elliptic waveguide channels to be provided, in which only one side wall is designed with the metallic conductive coating in the waveguide structure. As an alternative, polygonal waveguide channels may also be provided, which include a plurality of side walls including a metallic conductive coating.

The metallic conductive coating may be used for the soldering process when the coating is suitable for soldering and also extends across the solder spot. If this is not possible or when an improved soldering is to be achieved, an additional solderable coating may be provided in the area of the solder spot. This coating is applied prior to the waveguide structure being soldered to the surface of the circuit board.

Advantageously, the solderable coating is situated in such a way that it comes into contact with a soldering paste of the circuit board during the soldering process.

As described above, the waveguide channels serve as waveguides. To achieve a targeted radiation, emitting elements are provided. These are preferably implemented in the form of openings through the at least one coated side wall of the waveguide channel to the outside of the waveguide structure. The openings have a slot-shaped configuration, for example.

The waveguide structure may, as described above, be manufactured separately from the circuit board. It is thus also possible to design the waveguide structure as a modular unit. The modular unit is an independent module, which forms a self-contained functional unit and may be implemented to be structurally separated from the circuit board and is then soldered to the circuit board. It is also possible for multiple modular units to be connected to the same circuit board. Consequently, the same circuit board may be used for different modular units. The size of the waveguide structure may be selected independently of the size of the circuit board. In this way, depending on the application and requirements (e.g., in terms of range, angle coverage, angle accuracy, etc.), a corresponding modular unit may be formed. Moreover, it is possible to provide generic modules for different applications and requirements. The mounting position on the circuit board preferably remains the same for the different modular units. The implementation as modular units in accordance with an example embodiment of the present invention moreover offers further advantages:

- lower requirements with regard to the difference in the thermal coefficients of expansion between the waveguide structure and the circuit board;
- lower requirements with regard to the tolerances with respect to a positioning of the waveguide structure on the circuit board;
- lower requirements with regard to the layer design of the circuit board in terms of twisting and warping, both during the manufacturing process and with respect to aging and a temperature influence;
- the waveguide structure may be soldered better to the circuit board at the waveguide channel;
- in the case of separately situated modules, overcouplings between the waveguide channels, e.g., due to surface waves, may be minimized;
- multiway reflections between the waveguide structure and other components, such as e.g., a cover (radome) or a bumper of a vehicle, are reduced proportionally to the overall surface of the waveguide structures;
- approval, environmental and reliability tests may be considerably reduced since the antenna modules may correspond to a same-parts concept (identical outside dimensions and contact positions with the circuit board).

In particular, it is provided to form at least one sender module and at least one receiver module in each case as an independent waveguide structure, as described above, and to provide them separately from one another. The at least one sender module and the at least one receiver module are soldered in different spots to the surface of the circuit board. In this way, the sender module and the receiver module, as described above, may be designed or selected independently of one another.

Typically, radar sensors including a plurality of antenna channels are used today. It may be provided that multiple waveguide channels are jointly formed in a waveguide structure or in the multiple modular units. The emitting elements, and thus also the waveguide channels, may be designed as single emitters or be arranged in arrays and implement desired antenna parameters (such as e.g., antenna gain and side lobe attenuation). A precisely known distance and an exact alignment of the emitting elements of the individual sender modules and receiver modules are crucial for the performance of the radar sensor and, in particular, an angle estimation carried out therewith. The positions of the sender modules and of the receiver modules, in contrast, are freely selectable, and there are no special position requirements.

In accordance with an example embodiment of the present invention, the radar transceiver may essentially be mounted in two different variants at a surface of the circuit board. In one variant, the waveguide structure and the radar transceiver may be situated on different surfaces of the circuit board. The radar transceiver is preferably situated on the surface situated opposite the waveguide structure. The radar signal is then fed into the waveguide channel through the circuit board. For this purpose, waveguide transitions, coupling structures and/or hard-wired feeding using a metallized via may be provided. Since a circuit board is typically relatively thin, a short, direct coupling between the radar transceiver and the waveguide structure is possible. Further surface-mounted devices (SMDs) are preferably situated on the same surface as the radar transceiver. In this way, a one-sided mounting process is sufficient, by which the manufacturing costs are reduced. In addition, the circuit board is only heated on one side, and a heat conducting element may be provided on this side. In connection with the above-described modular units, additionally the advantage arises that the modular units of the waveguide structures may be situated and connected on the entire surface since no further components are provided on this surface. Moreover, an optical quality control of the SMDs and, above all, of the solder spots may be carried out from one side. Purely in principle, the further SMDs may also be situated at other, for example lateral, surfaces or at the same surface as the waveguide structure, and, if necessary, also beneath the waveguide structure.

In another variant, the waveguide structure and the radar transceiver may be situated on the same surface of the circuit board. The radar signal may then be coupled directly into one or multiple waveguide channel(s) or be decoupled therefrom. In this way, a simple coupling and decoupling of the radar signals is possible, and a via through the circuit board may be dispensed with. Further surface-mounted devices (SMDs) may preferably be situated on the same surface and on the opposite surface. In this way, a higher packing density is possible, which results in a small circuit board, and thus in a more compact radar sensor. However, due to the SMDs being situated on the surface of the waveguide structure, the space for the waveguide structure or for the waveguide channels is reduced. Purely in principle, the further SMDs may also be situated at other surfaces. When the radar transceiver and/or the SMDs are situated on the same surface as the waveguide structure and covered by the waveguide structure, they are shielded by the metallic coating of the waveguide structure. In this way, the waveguide structure also acts as a shielding cage in the sense of electromagnetic compatibility (EMC).

The waveguide structure which is open on one side moreover enables further options for transitions into the circuit board for coupling and decoupling the radar signals into and from the waveguide channels. The waveguide channel may be partially continued in the circuit board. In this way, good coupling and decoupling directly in the waveguide channel is made possible by structuring of the circuit board. For this purpose, vias may be provided, which protrude into the waveguide channels. The transition into the circuit board may take place in one stage or in multiple stages in the waveguide channel, or may take place by chamfers or other adaptation structures. The waveguide channels may now be fed via a single line.

Additionally, in accordance with an example embodiment of the present invention, a radar sensor is provided, which includes a circuit board, a waveguide structure made of plastic, and a radar transceiver. The waveguide structure is soldered to a surface of the circuit board. Additionally, the waveguide structure includes waveguide channels including at least one metallic conductively coated side wall. A further delimitation of the waveguide channels is formed by the circuit board. The radar transceiver is formed on a surface of the circuit board. For the advantages and possible refinements of the radar sensor, reference is made to the above description.

BRIEF DESCRIPTION OF THE DRAWINGS

Exemplary embodiments of the present invention are shown in the figures and are described in greater detail in the following description.

DETAILED DESCRIPTION OF EXAMPLE EMBODIMENTS

Figure 1:
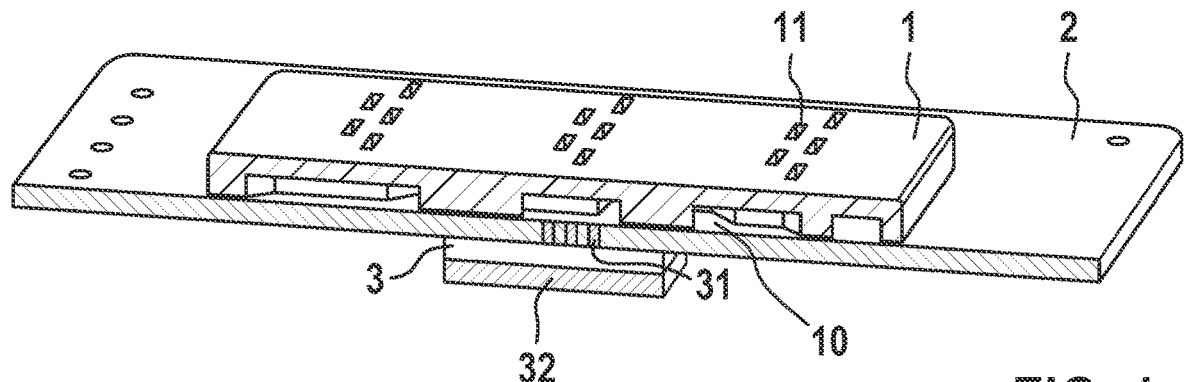
FIG. 1 shows a cut isometric view of a radar sensor according to one exemplary embodiment of the present invention.

FIG. 1 shows a cut isometric view of a radar sensor according to one exemplary embodiment of the present invention. The radar sensor includes a waveguide structure 1 made of plastic, which is designed in the shape of a block, and a circuit board 2, which is made up of multiple layers (multi-layer circuit board) and was manufactured with the aid of standard FR4 technology. Waveguide structure 1 was connected to a surface of circuit board 2 (hereafter referred to as the upper side) using a soldering process, which is described in detail hereafter. Waveguide structure 1 includes multiple waveguide channels 10 having a rectangular cross-section, which together with the surface of circuit board 2 serve as waveguides for radar signals. In this way, an antenna structure for the radar sensor is formed. For a detailed description of waveguide channels 10, reference is made to the following description. Multiple slot-shaped openings are formed in waveguide structure 1, which connect waveguide channels 10 to the surface of waveguide structure 1 and serve as emitting elements 11 for the radar signals. The radar sensor furthermore includes a radar transceiver 3, which in this example is situated as a surface-mounted device (SMD) at the surface of circuit board 2, which is located opposite waveguide structure 1 (hereafter referred to as the underside) and designed as a monolithic microwave integrated circuit (MMIC). Radar transceiver 3 is connected via multiple vias 31 through circuit board 2 to waveguide channels 10 of waveguide structure 1. Radar transceiver 3 generates radar signals, which are emitted by the radar sensor, and feeds these with the aid of vias 31 into waveguide channels 10, which then emit the radar signals via emitting elements 11. Radar signals, which are picked up by the radar sensor with the aid of emitting elements 11 and waveguide channels 10, are conducted with the aid of vias 31 to radar transceiver 3 and processed there. Radar transceiver 3 additionally includes a heat conducting material 32, with the aid of which the heat arising in radar transceiver 3 is dissipated to a housing, which is not shown.

Figure 2:
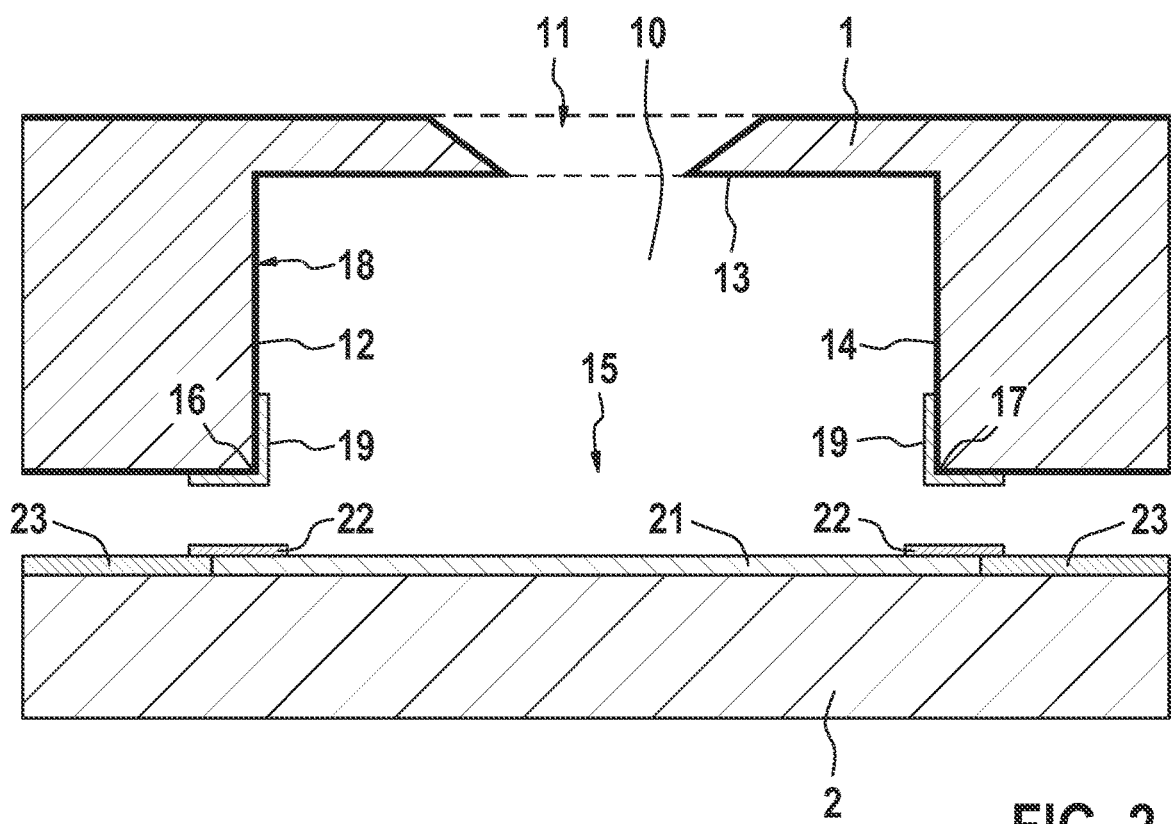
FIG. 2 shows a section of a sectional view of a waveguide structure and a circuit board prior to the soldering process according to one specific embodiment of the method according to the present invention.

FIG. 2 shows a section of a sectional view of waveguide structure 1 and circuit board 2. Here, waveguide structure 1 and circuit board 2 are not yet soldered to one another. A waveguide channel 10, which includes three side walls 12, 13, 14 formed by waveguide structure 1, is formed in waveguide structure 1. In the cross-section, the three side walls 12, 13, 14 represent three sides of a rectangle. A fourth side 15 of the rectangle is open and oriented in the direction of circuit board 2. At least side walls 12, 13, 14, and in this exemplary embodiment the entire surface of waveguide structure 1, are coated with a metallic, electrically conductive coating 18. The upper side wall 13 of waveguide channel 10 has the slot-shaped opening which serves as emitting element 11. At the corners between open side 15 of waveguide channel 10 and sides 12 and 14, solder spots 16, 17 for the soldering to the surface of circuit board 2 are provided. A solderable coating 19 is additionally provided at solder spots 16, 17. If the metallic, electrically conductive coating 18 is also sufficiently solderable and extends across solder spots 16, 17, the additional solderable coating 19 may be dispensed with. Circuit board 2 includes a copper layer 21, at least on the surface facing waveguide structure 1. At the spots which correspond to the aforementioned solder spots 16, 17, a soldering paste 22 is applied to the surface of circuit board 2. In addition, a solder resist 23 is provided toward the outside, which delimits the soldering to solder spots 16, 17.

Figure 3:
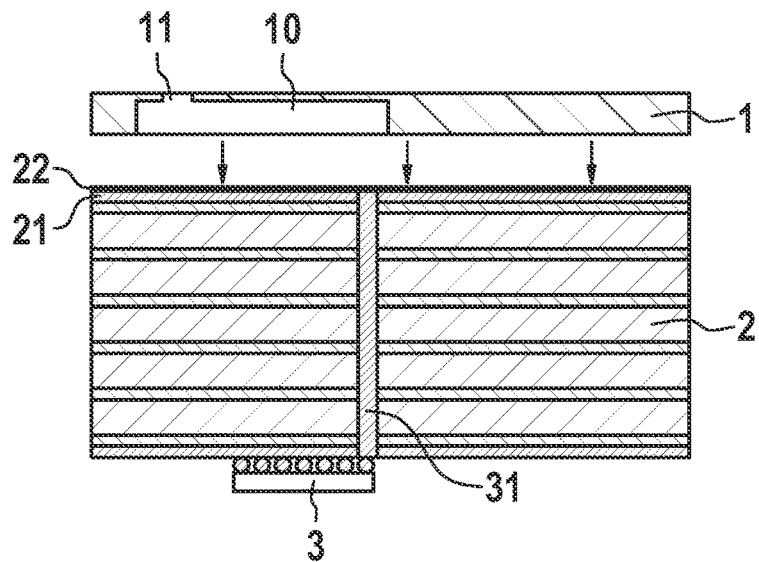
FIG. 3 shows a further section of a further sectional view of the waveguide structure and the circuit board prior to the soldering process according to one specific embodiment of the method according to the present invention.

FIG. 3 shows a further section, which shows waveguide structure 1 and circuit board 2 in full height prior to the soldering process, in a further sectional view perpendicular to that of FIG. 2. Identical elements are denoted by the same reference numerals, and reference is made to the above description in this regard. Radar transceiver 3 is mounted to the underside, i.e., the surface situated opposite waveguide structure 1, of circuit board 2 even prior to soldering. In further specific embodiments, radar transceiver 3 may also be mounted after soldering. Waveguide channels 10 and vias 31 are situated in such a way that they are coupled to one another after soldering. Waveguide structure 1 is mounted to the surface of circuit board 2 using soldering paste 22. Thereafter, waveguide structure 1 and circuit board 2 are soldered to one another at least at solder spots 16, 17. For this purpose, reflow soldering, which is known per se, is used, with the aid of soldering paste 22 situated at solder spots 16, 17 on circuit board 2. A tensile force arises during the soldering process, which ensures that waveguide channel 10 is closed all the way around in a planar manner, without critical air gaps. Moreover, a melting of the solder in soldering paste 22 occurs during the soldering process, so that surface tension arises in the solder. In this way, a self-centering of waveguide structure 1 and of circuit board 2 takes place during the soldering process.

Figure 4:
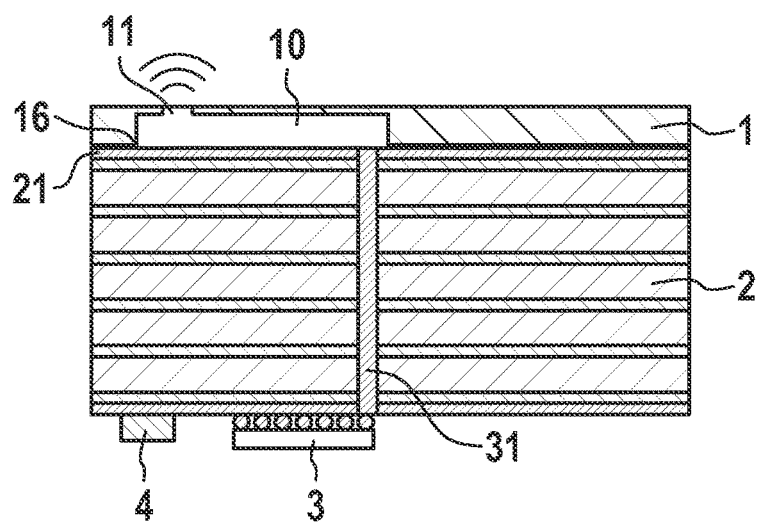
FIG. 4 shows a section of the sectional view of the waveguide structure and the circuit board after the soldering process according to one specific embodiment of the method according to the present invention.

FIG. 4 shows a section from FIG. 3 after the soldering according to one specific embodiment. After the soldering process, waveguide structure 1 and circuit board 2 are fixedly connected. Copper layer 21 at the surface of circuit board 2 closes open side 15 of waveguide channel 10, so that a completely closed rectangular waveguide channel 10 arises, which serves as a waveguide. In this specific embodiment, further SMDs 4 are situated at the underside of circuit board 2.

Figure 5:
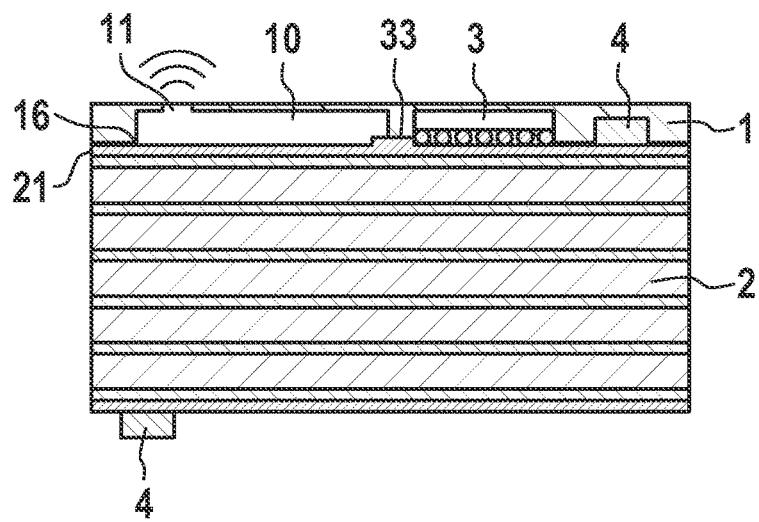
FIG. 5 shows a section of a sectional view of the waveguide structure and the circuit board after the soldering process according to a further specific embodiment of the method according to the present invention.

FIG. 5 shows a further specific embodiment. Again, waveguide structure 1 and circuit board 2 are shown after soldering. The specific embodiment differs from that described above in that radar transceiver 3 is mounted to the upper side, i.e., to the same surface as waveguide structure 1, of circuit board 2. In this example, radar transceiver 3 is surrounded by waveguide structure 1, and is thus shielded. A via 31 through circuit board 2 may be dispensed with. Instead, radar transceiver 3 is coupled with the aid of a direct contacting 33 to waveguide channel 10. In this specific embodiment, further SMDs 4 are situated both at the underside and at the upper side (beneath waveguide structure 1) of circuit board 2. This specific embodiment, in which radar transceiver 3 is mounted to the upper side of circuit board 2, may be applied to the further exemplary embodiments.

In the preceding exemplary embodiments, only one waveguide channel 10 was described. Typically, however, multiple antenna channels, e.g., up to 32 channels, are provided.

Figure 6A:
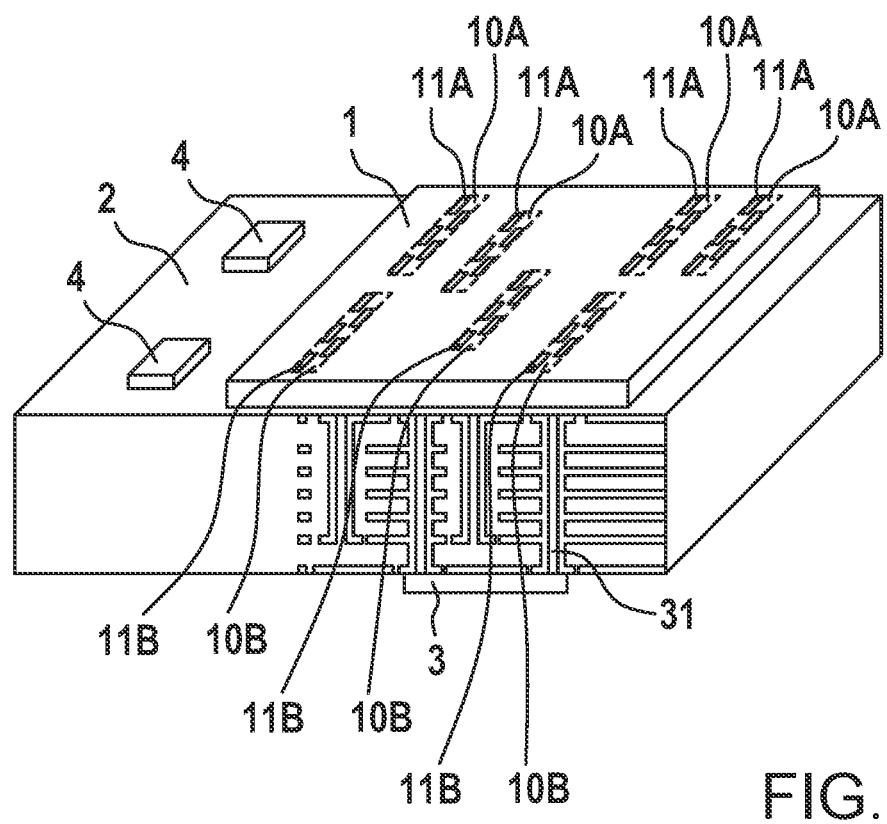
FIGS. 6A and 6B each show isometric views of two exemplary embodiments of the radar sensor according to the present invention.
Figure 6B:
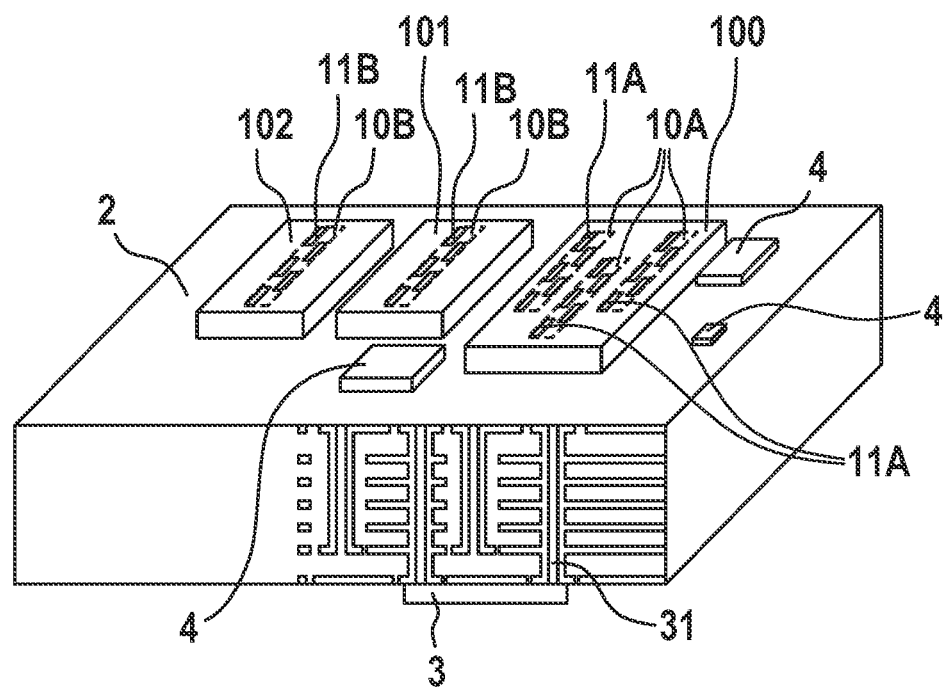

FIGS. 6A and 6B show two exemplary embodiments with the aid of which multiple antenna channels are implemented. Here as well, identical elements are denoted by the same reference numerals, and reference is made to the above description. In FIG. 6A, waveguide structure 1 is configured as a modular unit, which forms a self-contained functional unit and combines the functions of sending radar signals and receiving reflected radar signals. In this exemplary embodiment, waveguide structure 1 for this purpose includes four waveguide channels 10A, including corresponding emitting elements 11A for sending the radar signals, and another three waveguide channels 10B, including corresponding emitting elements 11B for receiving the radar signals, which are separately connected to radar transceiver 3. The size of waveguide structure 1 may be selected independently of the size of circuit board 2, so that in this exemplary embodiment the upper side of circuit board 2 is equipped with SMDs 4.

In FIG. 6B, multiple modular units of the waveguide structure are formed, instead of one modular unit which combines the sending and receiving functions. A first modular unit 100 is designed as a sender module and is only used to send radar signals. For this purpose, sender module 100 includes three waveguide channels 10A, including corresponding emitting elements 11A for sending the radar signals. Two further modular units 101 and 102 are designed as receiver modules and are only used to receive radar signals. For this purpose, each receiver module 101, 102 includes a waveguide channel 10B, including corresponding emitting elements 11B for receiving the radar signals. Modular units 100, 101, 102 are independent of one another in their size and of the size of circuit board 2, so that in this exemplary embodiment the upper side of circuit board 2 is equipped with SMDs 4.

The number of the waveguide channels and of the emitting elements may be selected as a function of the application. Moreover, the modular units may be exchanged as a function of the application and be differently combined with one another. Moreover, it is possible to provide multiple generic modules so that the radar sensor may be assembled from a kit. In the process, the positions of the modules on the circuit board are the same, so that the solder spots do not change. Moreover, further SMDs 4 may additionally also be situated at the underside or at one of the other sides of circuit board 2 in the described exemplary embodiments.

Figure 7A:
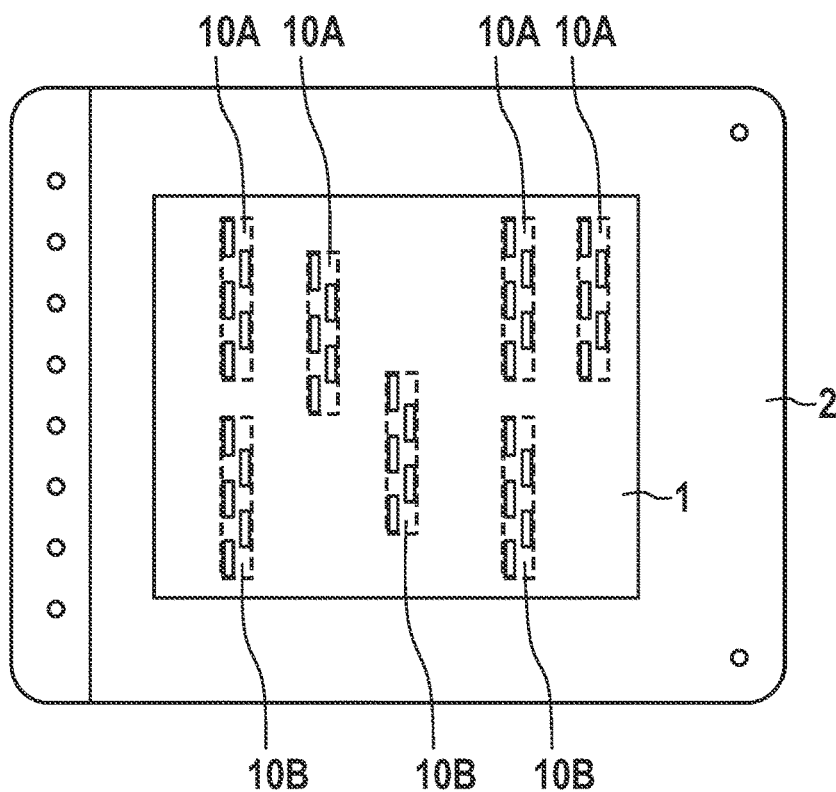
FIGS. 7A through 7D each show top views of multiple exemplary embodiments of the radar sensor according to the present invention.
Figure 7B:
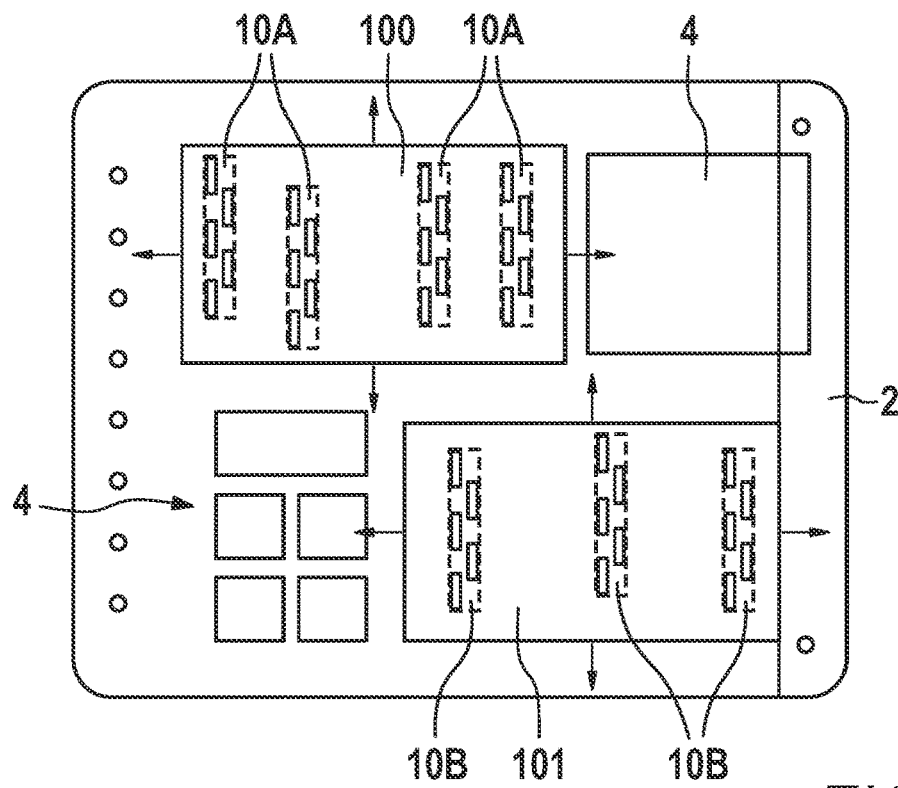
Figure 7C:
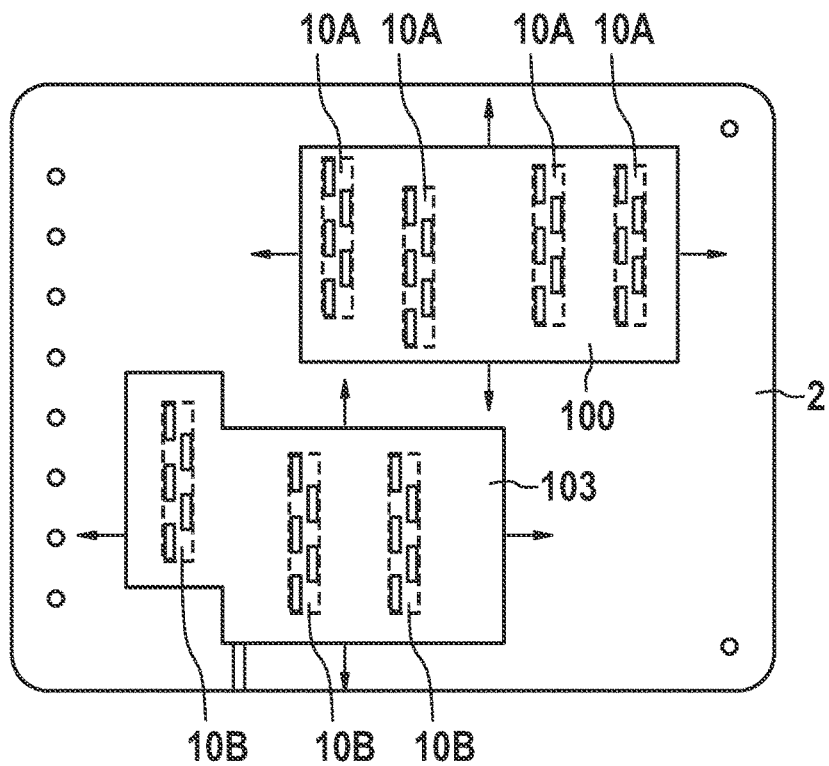
Figure 7D:
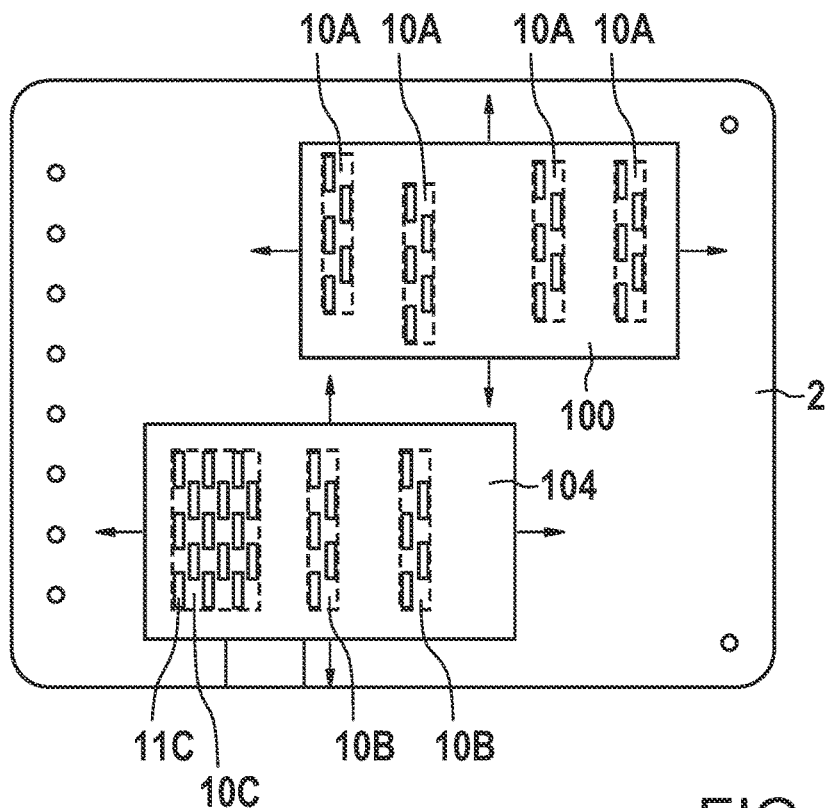

FIGS. 7A through 7D each show top views onto the radar sensor of multiple exemplary embodiments, which represent different arrangements of modular units. FIG. 7A shows the arrangement of FIG. 6A without SMDs 4. The modular unit assumes the sending and receiving functions here. FIG. 7B shows a sender module 100 and a receiver module 101, as described in FIG. 6B. Sender module 100 is designed to send the radar signals, and receiver module 101 is designed to receive the radar signals. The positions of the two modules 100 and 101 may be selected arbitrarily, and they may be shifted with respect to one another, which is represented by the arrows. Only an exact distance and an exact orientation of modules 100 and 101 with respect to one another is of importance for the evaluation, in particular, an angle estimation, by the radar sensor. In this way, space may be created for multiple SMDs 4 on the surface of circuit board 2. This also applies to the exemplary embodiments described hereafter. FIG. 7C also shows a sender module 100 and a receiver module 103. Receiver module 103 has a different shape compared to that in FIG. 7B. FIG. 7D also shows a sender module 100 and a receiver module 104. In addition to the individual waveguide channels 10B, receiver module 104 in this example also includes a waveguide channel array 10C, including a plurality of emitting elements 11C, which is also used to receive the radar signals.

In all specific embodiments, it may additionally be provided that waveguide channel 10 is partially continued in circuit board 2 (not shown). For this purpose, metallized vias may be provided, which protrude into waveguide channel 10. The transition into circuit board 2 may take place in one stage or in multiple stages in waveguide channel 10, or may take place by chamfers or other adaptation structures. Waveguide channel 10 is fed via a single line. For example, the end-point of the line has a distance of one quarter the wavelength with respect to side walls 12, 14 to thereby excite the H10 basic modes in the rectangular waveguide channel 10.

What is claimed is:

1. A method for manufacturing a radar sensor, comprising the following steps:
    providing a circuit board that has a copper layer;
    equipping a surface of the circuit board with a radar transceiver;
    applying a soldering paste so that the soldering paste is positioned at least at a plurality of attachment locations on the copper layer;
    providing a waveguide structure made of plastic;
    forming waveguide channels, each including at least one metallic conductively coated side wall in the waveguide structure and an open side, the waveguide channels each having a three-walled or U-shaped cross-section and having a length extending perpendicularly to the three-walled or U-shaped cross-section; and
    soldering a solderable material of the waveguide structure to the circuit board via the soldering paste, the open side being oriented in a direction of the circuit board so that the circuit board forms a floor of the waveguide channels to which each of the at least one side wall of the waveguide channels are directly connected, transforming the three-walled or U-shaped structure into a four-walled or O-shaped cross-section.

2. The method as recited in claim 1, wherein the waveguide channels are formed in a shape of a rectangle in cross-section, including three metallic conductively coated side walls.

3. The method as recited in claim 1, wherein a solderable coating is applied to the waveguide structure in an area of a solder spot prior to the waveguide structure being soldered to the circuit board.

4. The method as recited in claim 1, wherein emitting elements are implemented in the form of openings through the at least one coated side wall of the waveguide channels to an outside of the waveguide structure, the length of the waveguide channels extending perpendicularly to a direction from the floor formed by the circuit board to the openings.

5. The method as recited in claim 1, wherein the waveguide structure is a modular unit.

6. The method as recited in claim 5, wherein at least one sender module and at least one receiver module are provided separately from one another and soldered in different spots to the circuit board.

7. The method as recited in claim 1, wherein the waveguide structure and the radar transceiver are situated on different sides of the circuit board.

8. The method as recited in claim 1, wherein the waveguide structure and the radar transceiver are situated on the same side of the circuit board.

9. The method as recited in claim 1, wherein the circuit board has at least one via that extends upward into at least one of the waveguide channels.

10. A radar sensor, comprising:
    a circuit board having a copper layer;
    a waveguide structure that:
        is made of plastic; and
        includes waveguide channels, each:
            (I) including at least one metallic conductively coated side wall;
            (II) having a three-walled or U-shaped cross-section and having a length extending perpendicularly to the three-walled or U-shaped cross-section with an open side; and
            (III) having edges of the open side that are soldered to the circuit board at location of solder paste material applied to the copper layer of the circuit board, such that the circuit board forms a floor of the waveguide channels to which each of the at least one side wall of the waveguide channels are directly connected, a combination of the three-walled or U-shaped cross-section of the waveguide channels and the floor formed by the circuit board thereby forming a four-walled or O-shaped cross-section; and
    a radar transceiver situated on a surface of the circuit board.

* * * * *